(12) United States Patent
Miwa et al.

(10) Patent No.: US 7,348,944 B2
(45) Date of Patent: Mar. 25, 2008

(54) IMAGE DISPLAY DEVICE

(75) Inventors: Koichi Miwa, Kanagawa (JP); Takatoshi Tsujimura, Kanagawa (JP)

(73) Assignees: Kyocera Corporation, Kyoto-Shi (JP); Chi Mei Optoelectronics Corp., Tainan County (TW)

( * ) Notice: Subject to any disclaimer, the term of this patent is extended or adjusted under 35 U.S.C. 154(b) by 533 days.

(21) Appl. No.: 11/081,554

(22) Filed: Mar. 17, 2005

(65) Prior Publication Data
US 2005/0237282 A1 Oct. 27, 2005

(30) Foreign Application Priority Data
Mar. 18, 2004 (JP) ............... 2004-078575

(51) Int. Cl.
*G09G 3/30* (2006.01)
(52) U.S. Cl. .......................................... 345/76; 345/90
(58) Field of Classification Search ............ 345/76–83, 345/87–100, 204; 315/169.1, 169.2, 169.3
See application file for complete search history.

(56) References Cited

U.S. PATENT DOCUMENTS

| 5,684,365 | A | 11/1997 | Tang et al. |
| 6,501,466 | B1 | 12/2002 | Yamagishi et al. |
| 7,193,589 | B2 * | 3/2007 | Yoshida et al. ............... 345/76 |
| 7,199,768 | B2 * | 4/2007 | Ono et al. ..................... 345/76 |
| 2002/0140364 | A1 * | 10/2002 | Inukai ..................... 315/169.3 |
| 2003/0025656 | A1 * | 2/2003 | Kimura ........................ 345/82 |
| 2003/0189535 | A1 | 10/2003 | Matsumoto et al. |
| 2004/0090186 | A1 * | 5/2004 | Yoshida et al. ........... 315/169.1 |
| 2004/0207615 | A1 * | 10/2004 | Yumoto ....................... 345/211 |
| 2004/0252089 | A1 * | 12/2004 | Ono et al. ..................... 345/82 |
| 2005/0007307 | A1 * | 1/2005 | Aoki ............................ 345/55 |
| 2005/0012731 | A1 * | 1/2005 | Yamazaki et al. .......... 345/204 |

FOREIGN PATENT DOCUMENTS

| JP | 8234683 | 9/1996 |
| JP | 2001147659 A | 5/2001 |
| JP | 2003-108036 A | 4/2003 |
| JP | 2003140611 | 5/2003 |
| JP | 2003173154 A | 6/2003 |
| JP | 2003255897 | 9/2003 |

* cited by examiner

*Primary Examiner*—Nitin I. Patel
(74) *Attorney, Agent, or Firm*—Birch, Stewart, Kolasch & Birch, LLP

(57) ABSTRACT

A image display device includes a light-emitting device that emits light with a luminance depending on an electric current flowing therethrough, a driver that includes at least a first terminal and a second terminal and that supplies an electric current whose value is defined based on a potential difference between the first terminal and the second terminal to the light-emitting device, a potential difference supply unit that supplies the potential difference between the first terminal and the second terminal, a potential adjusting unit that adjusts so that the potential of the second terminal becomes reference potential while the potential difference supply unit supplies the potential difference, and a capacitor that is arranged between the first terminal and the second terminal and that holds the potential difference supplied from the potential difference supply unit.

13 Claims, 13 Drawing Sheets

IMAGE DISPLAY DEVICE

BACKGROUND OF THE INVENTION

1. Field of the Invention

The present invention relates to an image display device which emits light by a luminance control depending on electric potential difference between a first terminal and a second terminal of a driver.

2. Description of the Related Art

Recent years, a display device which employs an organic electroluminescent (EL) element draws attention instead of a liquid crystal display device in the field of the display such as image display. The display device which employs an organic EL element does not need a backlight since it is a self-luminous device, and has functions which surpass those of a liquid crystal display device, for example, high-responsivity, high-contrast, and high-visibility. The display device which employs an organic EL element is also considered to be advantageous in manufacturing cost since the device has a relatively simple structure (see Japanese patent Application Laid-open H08-234683).

For a high-luminance display realization, a large value of electric current needs to be flowing through an organic EL element which constitutes each pixel, since the organic EL element has a light-emitting mechanism depending on an electric current flowing therethrough. However, for avoiding damages to the elements such as organic EL element and thin-film transistors controlling the operation of an organic EL element, the large electric current flowing through the elements is not preferred. An image display device that series-connected plural organic EL elements are arranged for each pixel and improvement of luminance is achieved by emitting light from the plural organic EL elements at once, to avoid the operation with such a large electric current, is proposed.

FIG. 10 is a circuit diagram of a pixel circuit having series-connected plural organic EL elements and included in a conventional image display device. As shown in FIG. 10, the pixel circuit according to the conventional device has an emission mechanism 102 having series-connected organic EL elements 101a to 101d, a first thin-film transistor 103 whose source electrode is connected to the anode side of the emission mechanism 102 and which is a transistor for controlling the electric current value flowing through the emission mechanism 102, a constant potential line 104 connected to the cathode side of the emission mechanism 102, a power supply line 105 connected to the drain electrode of the first thin-film transistor 103, and a capacitor 106 connected between the first thin-film transistor 103 and the power supply line 105. The pixel circuit according to the conventional device has a data line driver circuit 108 supplying the gate electrode of the first thin transistor 103 with a data voltage corresponding to the luminance of the emission mechanism 102 via a data line 107, a second thin-film transistor 109 controlling the electric continuity between the data line 107 and the first thin-film transistor 103 as a switching device, and a scan line 110 connected to the gate electrode of the second thin-film transistor 109 and controlling the operation of the second thin-film transistor 109.

The pixel circuit according the conventional device will be explained. The first thin-film transistor 103 is turned ON and then the voltage corresponding to the display luminance is supplied to the gate electrode of the first thin-film transistor 103 from the data line 107. Since the first thin-film transistor 103 has a function of allowing the source-to-drain current to flow based on the gate voltage supplied, the emission mechanism 102 is supplied with the current according to the voltage supplied via data line 107, and then the emission mechanism 102 emits light with the luminance depending on the supplied current.

However, a problem of the conventional image display device having the series-connected organic EL elements 101a to 101d is that the load of the voltage supply circuit increases according to the increased range of the voltage level supplied via the data line 107. The details on the problem will be described below.

As shown in the circuit diagram of FIG. 10, the organic EL elements 101a to 101d can be considered electrically equivalent to light-emitting diodes, and can be treated as having the same voltage-current characteristics as those of the light-emitting diodes. Therefore, the anode-to-cathode voltage of each of the organic EL elements 101a to 101d has a tendency to increase according to the electric current value, in other words, according to the light emitting luminance. The anode-to-cathode voltage of the whole emission mechanism 102 is also increased according to the increase of the display luminance. As described above, the first thin-film transistor 103 controls the electric current value flowing through the emission mechanism 102 according to its gate-to-source voltage level, and the gate potential is supplied by the data line driver circuit 108 to enable the control.

From the evidences described above, the gate potential $V_g$ supplied from the data line driver circuit 108 can be represented with the potential $V_0$ of the constant potential line 104, the anode-to-cathode potential difference $nV_{OLED}$ (n is the number of organic EL elements) of the emission mechanism 102, and the gate-to-source voltage $V_{gs}$ of the first thin-film transistor as:

$$V_g = V_0 + nV_{OLED} + V_{gs} \quad (1)$$

where $V_0$ is almost a constant value, and $nV_{OLED}$ and $V_{gs}$ are various values depending on the display luminance of the emission mechanism 102. More specifically, the gate-to-source voltage $V_{gs}$ of the first thin-film transistor generally changes within a range from approximately 0 V to approximately 10 V, although the range depends on the structure of the transistor and the usage of the image display device. On the other hand, the variable range of the anode-to-cathode voltage $nV_{OLED}$ of the emission mechanism 102 changes, for example, from approximately 20 V to approximately 70 V when n is approximately 10.

In the conventional image display device, although the band of changes of the gate-to-source voltage of the thin-film transistor 103 which is necessary for the emission of the emission mechanism 102 at predetermined luminance is approximately 10 V, the data line driver circuit 108 must operate the potential supply within a large range from approximately 20 V to approximately 80 V because of the effect of the potential change at the anode side of the emission mechanism 102, therefore, the load of the data line driver circuit 108 is increased.

SUMMARY OF THE INVENTION

To solve the above problems, an object of the present invention is to provide an image display device which reduces the range of the potential applied to the driver and the load of the potential difference supply unit.

A image display device according to one aspect of the present invention includes a light-emitting device that emits light with a luminance depending on an electric current flowing therethrough, a driver that includes at least a first terminal and a second terminal and that supplies an electric current whose value is defined based on a potential difference between the first terminal and the second terminal to the light-emitting device, a potential difference supply unit that supplies the potential difference between the first terminal and the second terminal, a potential adjusting unit whose adjustment results in that the potential of the second terminal becomes reference potential while the potential difference supply unit supplies the potential difference, and a capacitor that is arranged between the first terminal and the second terminal and that holds the potential difference supplied from the potential difference supply unit.

A image display driving method according to another aspect of the present invention is for driving an image display device that includes a light-emitting device having a first terminal and a second terminal, and a thin-film transistor having a drain electrode, a source electrode, and a gate electrode where one of the drain and source electrodes being electrically connected to the first terminal of the light-emitting device. The method includes setting potentials of the drain and source electrodes so that the potentials are substantially the same by turning on the thin-film transistor and by supplying a predetermined potential to the other of the drain and source electrodes while the light-emitting device is in a non-emission state; supplying a luminance potential corresponding to a luminance of the light-emitting device to the gate electrode while the light-emitting device is in a non-emission state and the potentials are substantially the same; and supplying an electric current according to the supplied luminance potential to the light-emitting device to emit light from the light-emitting device.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of an image display device according to the present invention will be described below with reference to the accompanying drawings. The drawings should be understood as being exemplary only. It should be noted that, for example, the relation between the width and the thickness of each part or the ratio of the thickness of each part may differ from the reality, and the drawings may have parts which are different in size or ratio among drawings.

Figure 1:
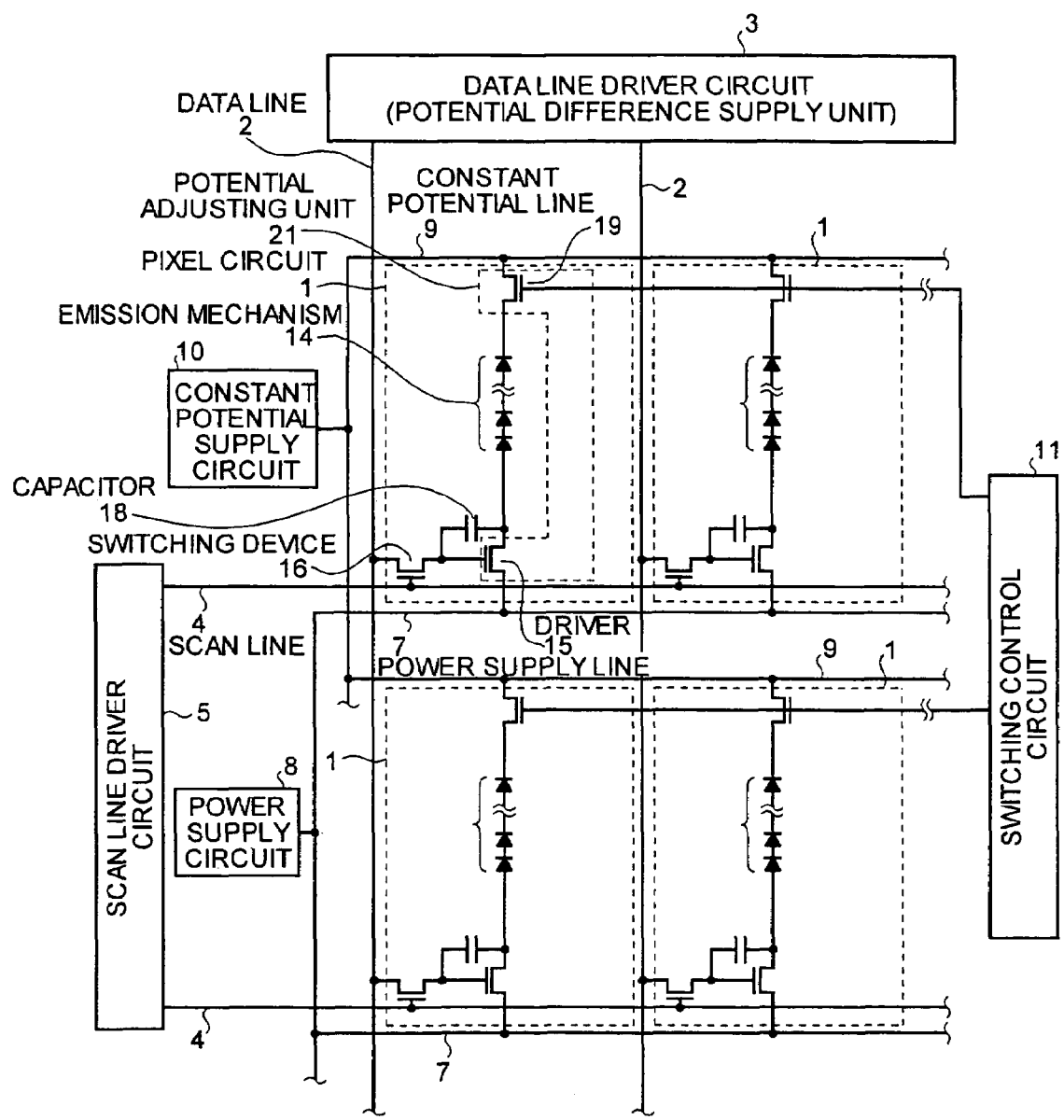
FIG. 1 is a schematic diagram of an overall structure of an image display device according to a first embodiment.

An image display device according to a first embodiment will be described. FIG. 1 is a schematic diagram of an overall structure of the image display device according to the first embodiment. As shown in FIG. 1, the display according to the first embodiment includes a plurality of pixel circuits 1 arranged in a matrix, a data line driver circuit 3 electrically connected to the pixel circuit 1 via a data line 2, a scan line driver circuit 5 electrically connected to the pixel circuit 1 via a scan line 4, a power supply circuit 8 electrically connected to the pixel circuit 1 via a power supply line 7, a constant potential supply circuit 10 electrically connected to the pixel circuit 1 via a constant potential line 9, and a switching control circuit 11 controlling a potential adjusting unit 21, which is explained later, included in the pixel circuit 1.

The data line driver circuit 3 supplies a predetermined potential difference, more specifically, the potential difference corresponding to the luminance displayed by the pixel circuit 1 to a driver 15, which is explained later, included in the pixel circuit 1. The scan line driver circuit 5 controls the operation of a switching device 16 included in the pixel circuit 1 by supplying a predetermined voltage sequentially via plural scan lines 4. The power supply circuit 8 supplies an electric power to the emission mechanism 14, which is explained later, included in the pixel circuit 1, via the power supply line 7. The constant potential supply circuit 10 supplies a potential of the cathode side of the emission mechanism 14. Although each of the power supply circuit 8 and the constant potential supply circuit 10 can be configured to supply variable potential, each of them is supposed to supply a constant potential in the first embodiment for simplicity.

The structure of the pixel circuit 1 will be explained. The pixel circuit 1 includes the emission mechanism 14 which emits light according to an input value of an electric current, the driver 15 which is formed to include a thin-film transistor and whose source electrode of the transistor is connected to the anode side of the emission mechanism 14, and the switching device 16 such that one source/drain electrode is connected to the gate electrode of the driver 15. The pixel circuit 1 includes the capacitor 18 arranged between the gate electrode and the source electrode of the driver 15, and the potential adjusting unit 21 which adjusts the potential of the source electrode of the driver 15 and which is formed to include the driver 15 itself.

The driver 15 has a structure that the source electrode is being connected to the anode side of the emission mechanism 14 and a function of controlling the value of current flowing into the emission mechanism 14. The gate electrode of the driver 15 is electrically connected to the data line driver circuit 3 via the switching device 16 and the data line 2, and then the potential difference is produced between the gate and the source by the potential supplied from the data line driver circuit 3. Due to the carrier mobility of the drain-to-source changes according to the potential difference, the driver 15 controls the value of current flowing into the emission mechanism 14 according to a voltage applied to the gate electrode.

Although the driver 15 can be constituted to include, for example, a thin-film transistor whose channel formation region is formed by, for example, the polycrystalline silicon, it is supposed in the first embodiment that the driver 15 is constituted to include a thin-film transistor whose channel formation region is formed by amorphous silicon of n-type. One of the advantages of the thin-film transistor using amorphous silicon is being able to reduce the difference in the electrical characteristics of the thin-film transistors formed on different places.

The switching device 16 is formed to include, for example, a thin-film transistor, and controls the electrical continuity between the driver 15 and the data line 2. More specifically, the switching device 16 has a structure that one source/drain electrode is connected to the gate electrode of the driver 15, that another source/drain electrode is connected to the data line 2, and that its gate electrode is electrically connected to the scan line driver circuit 5 via the scan line 4. Having the structure, the switching device 16 can control the electrical continuity between the data line 2 and the driver 15 according to the voltage supplied from the scan line driver circuit 5.

The capacitor 18 holds the gate-to-source voltage of the driver 15. More specifically, as shown in FIG. 1, capacitor 18 is arranged between the gate electrode and the source electrode of the driver 15, and has a certain level of capacitance where a parasitic capacitance between the gate and the source of the driver 15 can be ignorable.

Figure 2:
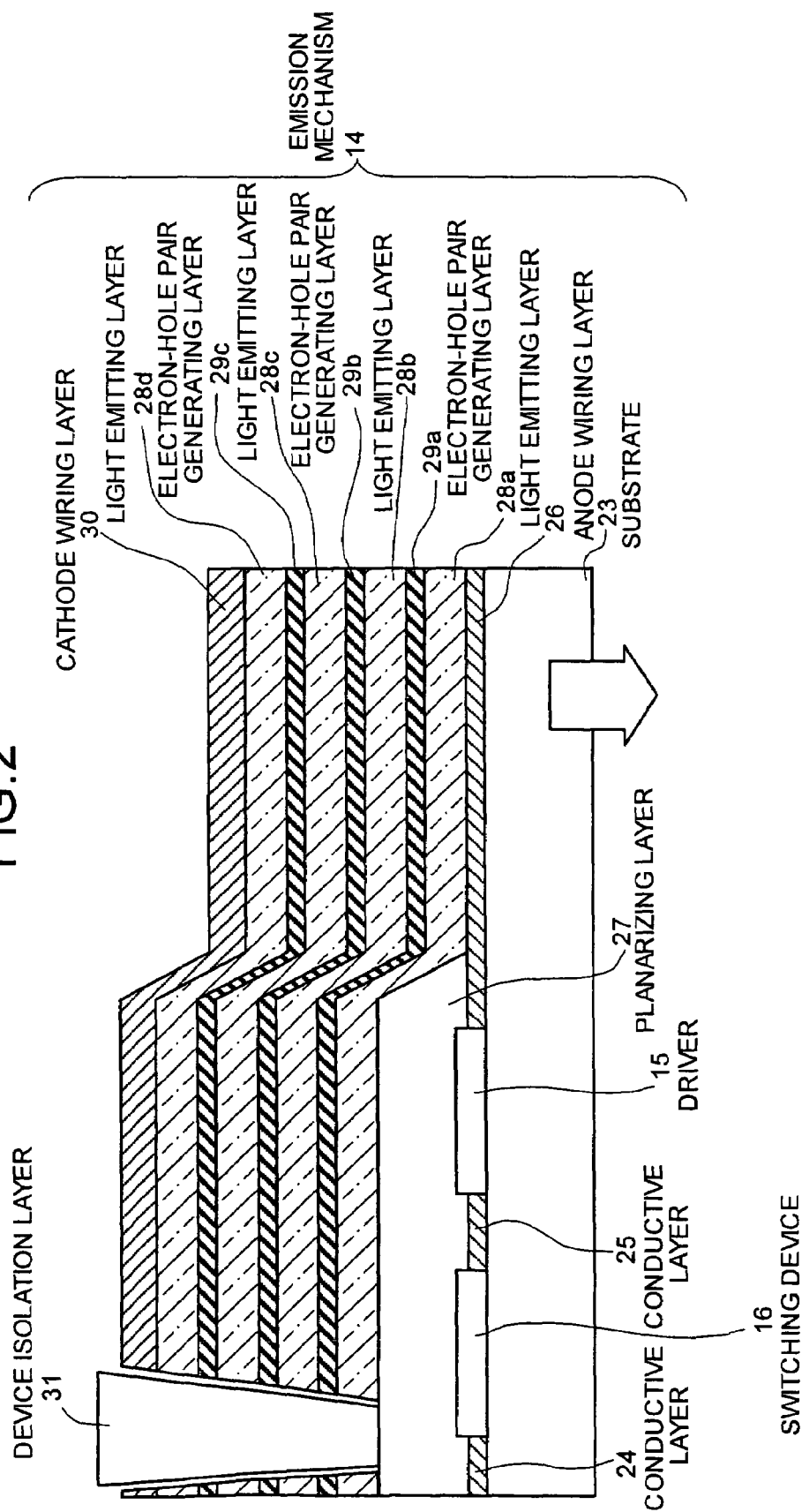
FIG. 2 is a sectional view of a specific structure of an emission mechanism provided in the image display device.

The emission mechanism 14, as shown in FIG. 1, has a structure which is considered electrically equivalent to series-connected light-emitting diodes. More specifically, the emission mechanism 14 has a structure shown in FIG. 2. The structure includes the driver 15, the switching device 16, and the conductive layer 24 and 25 formed on one part of a substrate 23, an anode wiring layer 26 formed on another part of the substrate 23, and a light emitting layer 28*a*, an electron-hole pair generating layer 29*a*, a light emitting layer 28*b*, an electron-hole pair generating layer 29*b*, a light emitting layer 28*c*, an electron-hole pair generating layer 29*c*, a light emitting layer 28*d*, and a cathode wiring layer 30 layered one after another on the anode wiring layer 26 and a planarizing layer 27. Furthermore, a device isolation layer 31 is arranged between plural emission mechanisms 14, and then each of plural emission mechanisms 14 has an electrically isolated structure.

The anode wiring layer 26 is made of a conductive material, such as Au (gold), Cu (copper), or ITO (Indium Tin Oxide), and in order to allow the transmission of the light produced in the light emitting layers 28*a* to 28*d*, has, for example, a thin-filmed structure. The light emitting layers 28*a* to 28*d* are made of an organic material, such as phthalcyanine, tris-aluminum complex, benzoquinolinolato, or beryllium complex, and to which predetermined impurity is added if necessary. The electron-hole pair generating layers 29*a* to 29*c* are made of a conductive material having a light-transmittable characteristic, and more specifically and preferably, are made of a transparent conductive material such as metal oxide, such as ITO or IZO (Indium Zinc Oxide). Due to ITO's high electronegativity, each of the electron-hole pair generating layers 29*a* to 29*c* can also be configured to include a conductive layer including a metal material such as cesium (Cs) below the ITO layer. For the conductive layer, BPHPEN containing cesium or BCP is preferably used. The cathode wiring layer 30 is made of a conductive material like metal, such as Al or Cu. Since the image display device according to the first embodiment is configured to give off the light produced in the light emitting layers 28*a* to 28*d* toward outside through the substrate 23, the cathode wiring layer 30 needs not to have a characteristic of light transmission, and therefore the film thickness can be increased.

Figure 3:
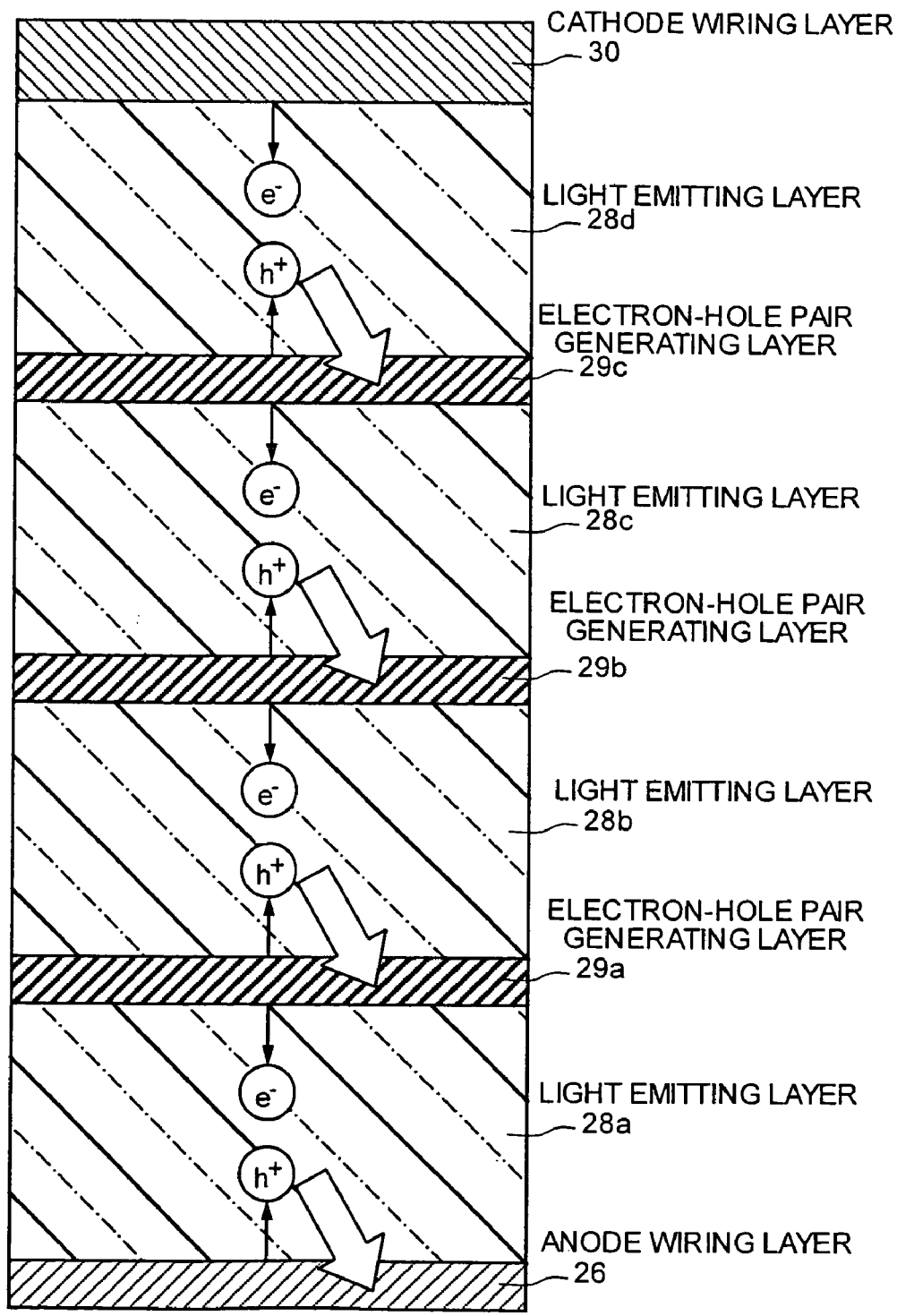
FIG. 3 is a schematic diagram shown to describe a light-emitting mechanism of an emission mechanism.

FIG. 3 is a schematic diagram shown to describe a light-emitting mechanism of the emission mechanism 14. In the light emitting layers 28*a* to 28*d*, the recombination of electrons and holes supplied from the outside excites molecules of an organic material forming the light emitting layers 28*a* to 28*d*, then those excited molecules return to their ground state and a surplus energy is produced, and then the surplus energy is transformed to light and a light emission occurs. The electron-hole pair generating layers 29*a* to 29*c* forming the emission mechanism 14 have functions of supplying electrons towards the anode wiring layer 26, and of supplying holes towards the cathode wiring layer 30, while a predetermined potential is applied to each layer. Since including the electron-hole pair generating layers 29*a* to 29*c*, the image display device according to the first embodiment emits light with sufficient luminance by a small current.

The light-emitting mechanism in the light emitting layer 28*c* will be described as an example. The holes produced in the electron-hole pair generating layer 29*b* and the electrons produced in the electron-hole pair generating layer 29*c* flow into the light emitting layer 28*c*, and then light is produced while the holes and the electrons are recombined in the light emitting layer 28*c*. The holes and electrons supplied to the light emitting layer 28*c* are both produced within the emission mechanism 14, and either is not supplied from the outside of emission mechanism 14. Therefore, the charged particles contributing to a light emission in the light emitting layer 28*c* are not directly related to the charged particles traveling through the cannel layer of the driver 15, so the cannel layer of the driver 15 is not affected by the light emission in the light emitting layer 28*c*. Therefore, the emission mechanism 14 can emit light corresponding to a value of the electric current supplied via the driver 15 at a higher efficiency than the conventional image display device can. In other words, the emission mechanism 14 can reduce the value of the electric current flowing through the driver 15 as well as reduce damages to the thin-film transistor forming the driver 15, when the mechanism is emitting light at the same luminance.

The potential adjusting unit 21 will be described next. The potential adjusting unit 21 adjusts a potential so that the potential at the source electrode of the driver 15 should be kept[MSOffice1] at a predetermined level [MSOffice2] while a potential corresponding to the display luminance is supplied from the data line driver circuit 3. More specifically, the potential adjusting unit 21, having the potential-adjusting functions, changes the cathode side of the emission mechanism 14 to a floating state prior to the operation of the potential supply corresponding to the display luminance, and at the same time, supplies a predetermined potential to the source electrode of the driver 15, so that the potential at the source electrode of the driver 15 becomes a predetermined level while the luminance potential is supplied. As shown in FIG. 1, the specific potential adjusting unit 21 has a structure including the driver 15 functions as an example of a first switching unit, a switching device 19 functions as an example of a second switching unit, and the switching control circuit 11 that controls the operation of the switching device 19, each of which is formed to include a thin-film transistor.

The switching device 19 is arranged between the cathode side of the emission mechanism 14 and a constant power supply line 9, and changes the cathode side of the emission mechanism to the floating state by controlling the electrical continuity between the emission mechanism 14 and the constant power supply line 9, during the potential adjustment of the source electrode of the driver 15. More specifically, the switching device 19 has a structure which operates according to the voltage supplied from the switching control circuit 11. In other words, the switching device 19, which is formed to include, for example, a thin-film transistor of n-type, maintains the electrical continuity when a voltage not less than its on-voltage is applied to the gate electrode, and breaks the electrical continuity when a voltage less than its on-voltage is applied.

The driver 15, when functioning as the first switching unit included in the potential adjusting unit 21, operates so that the potential of its source electrode become a predetermined level. The driver 15 is kept to be ON during a potential adjustment which is explained later, and operates to supply the potential of the power supply line 7 connected to the drain electrode to the source electrode, so that the potential of the source electrode should be a predetermined level. It is also possible to have a structure that controls the source potential of the driver 15 to be a predetermined level by the first switching unit during the potential adjustment by including a first switching unit independently besides the driver 15, and which is controlling.

The operation of the image display device according to the first embodiment will be explained. FIGS. 4A to 4D are schematic diagrams shown to describe the operation of the image display device according to the first embodiment. The switching devices 16 and 19 are shown as simple switches in FIGS. 4A to 4D to help understanding of the operation. In FIGS. 4A to 4D, a point on the power supply line 7 is represented as A, the source electrode of the driver 15 is represented as B, the gate electrode of the driver 15 is represented as C, and a point on the constant potential line 9 is represented as D, and the potential at each point is represented as $V_A$, $V_B$, $V_C$, and $V_D$ respectively. Since the power supply line 7 and the constant potential line 9 are supplied with predetermined potentials, $V_A$ and $V_D$ are kept to be those predetermined values through the FIGS. 4A to 4D.

Figure 4A:
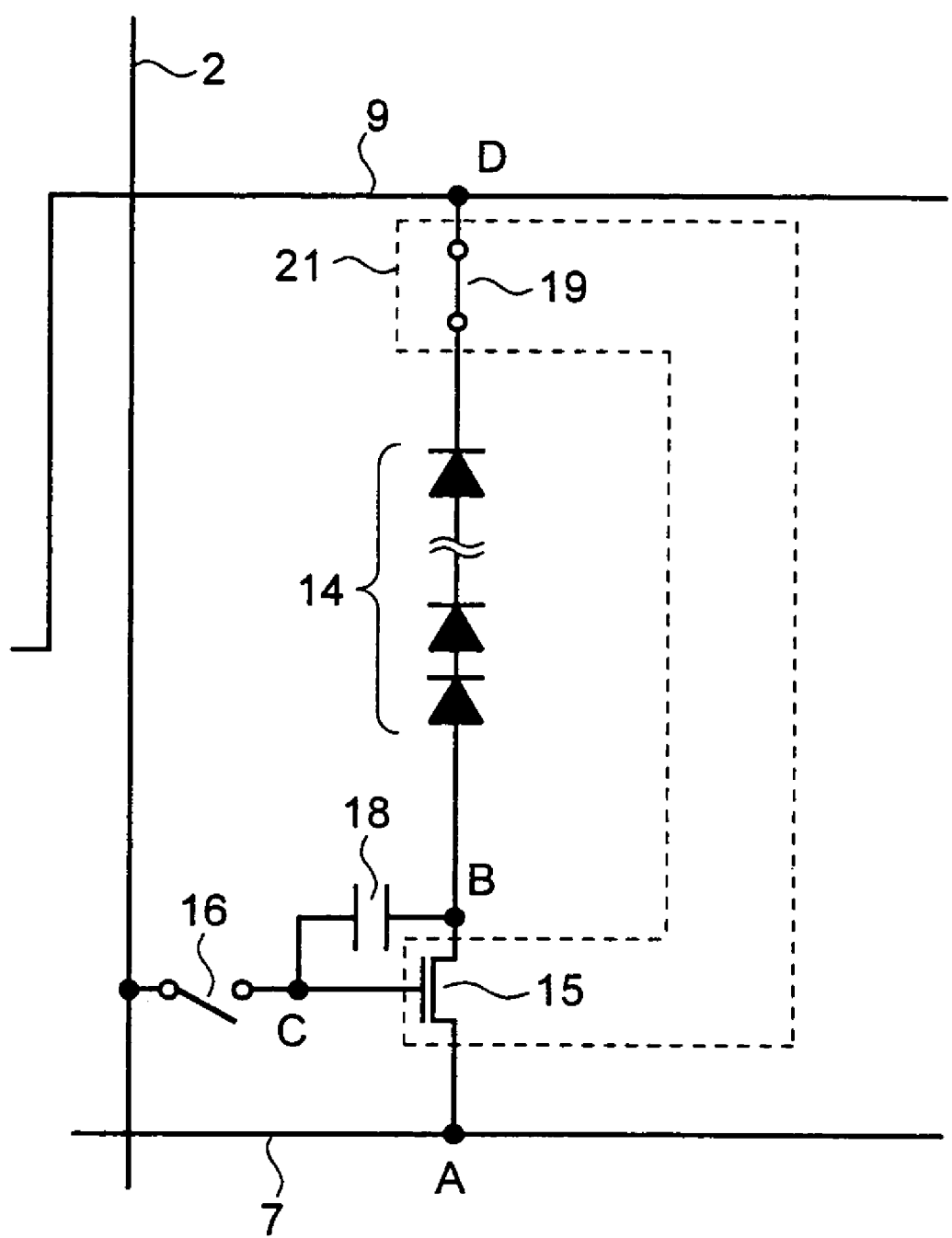
FIGS. 4A to 4D are schematic diagrams shown to describe operations of a emission mechanism.

As shown FIG. 4A, the emission mechanism 14 is emitting light at a predetermined luminance, more specifically, it is controlled so that the switching device 16 is being OFF while the switching device 19 is being ON. The potential corresponding to the display luminance is applied to the gate electrode of the driver 15, and a predetermined potential difference not less than its ON-voltage is produced between the gate and the source of the driver 15. Therefore, the electric current supplied from the power supply line 7 flows from the drain-to-source of the driver 15, through the emission mechanism 14, switching device 19, and to the constant potential line 9, and light is produced in the emission mechanism 14 according to the value of the electric current flowing in. Since the emission mechanism 14 can be considered electrically equivalent to series-connected light-emitting diodes as already explained, the potential according to the electric current flowing through is produced between the anode and the cathode of the emission mechanism 14. The potential $V_B$ at Point B (the source electrode of the driver 15) can be represented as:

$$V_B = nV_{OLEDO}[MSOffice3] + V_D \quad (2)$$

where n is the number of the electrically equivalent diodes included in the emission mechanism 14, and $V_{OLEDO}$ [MSOffice4] is the potential difference produced in an electrically equivalent diode.

Figure 4B:
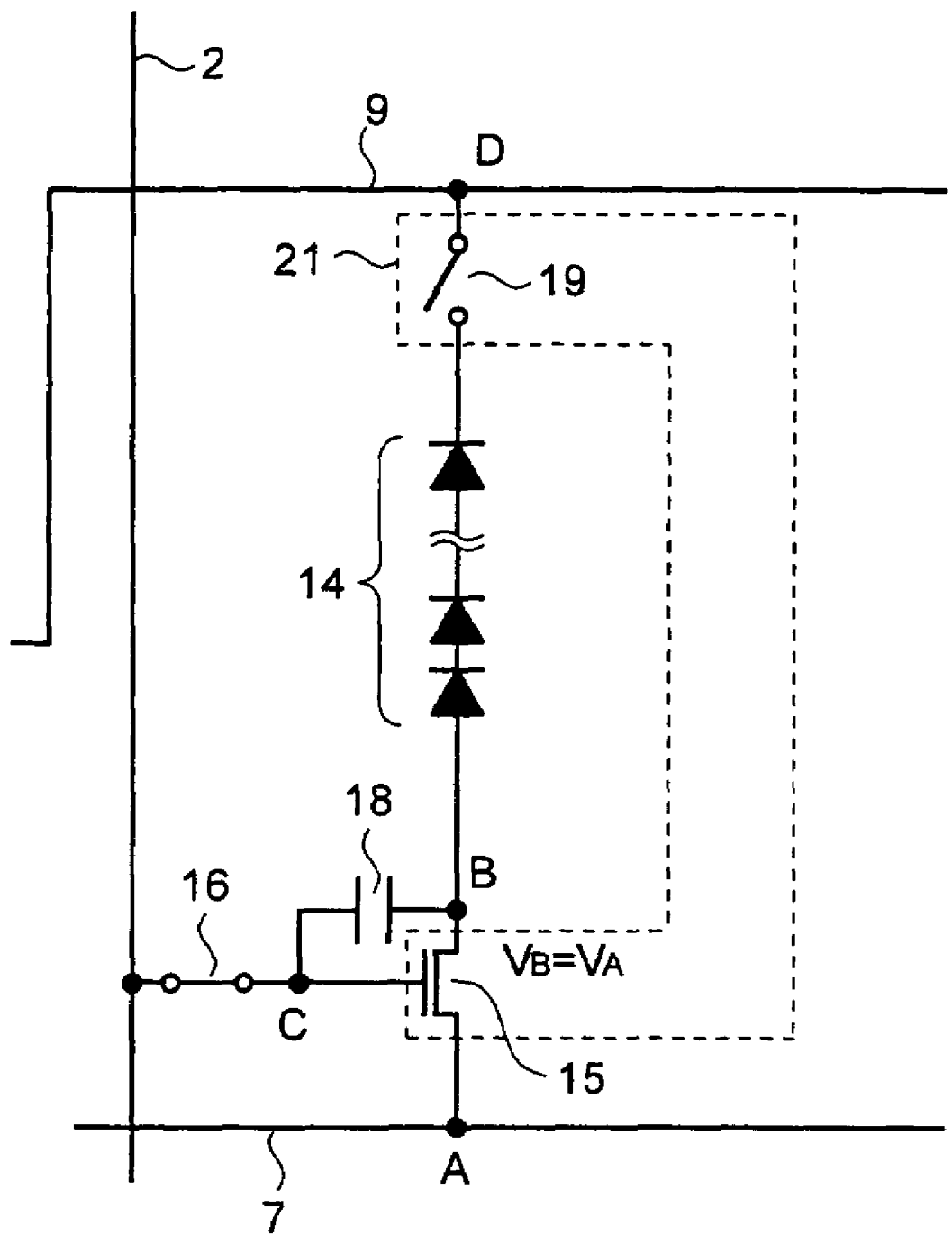

As shown in FIG. 4B, the light emission of the emission mechanism 14 ends, and the potential at the source electrode of the driver 15 is adjusted. More specifically, the switching device 16 becomes ON, and the switching device 19 becomes OFF. The data line 2 is kept to have the potential level in which the electric current flowing between the drain and the source of the driver 15 is sufficiently large, and since the potential is applied to the gate electrode of the driver 15 via the switching device 16, the driver 15 is being ON. In the state shown in FIG. 4B, the electric current flowing through the emission mechanism 14 becomes zero since the switching device 19 becomes OFF, and the potential of the power supply line 7 is supplied to the source electrode of the driver 15 via the driver 15 being ON. Therefore, the potential $V_B$ in the state shown in FIG. 4B changes as:

$$V_B = V_A \quad (3)$$

Here, as shown in FIG. 4A, since a potential of relatively high level is supplied to the gate electrode of the driver 15 prior to the potential adjustment, Expression (3) can be satisfied although the switching device 16 is kept to be OFF in the state shown in FIG. 4B.

Figure 4C:
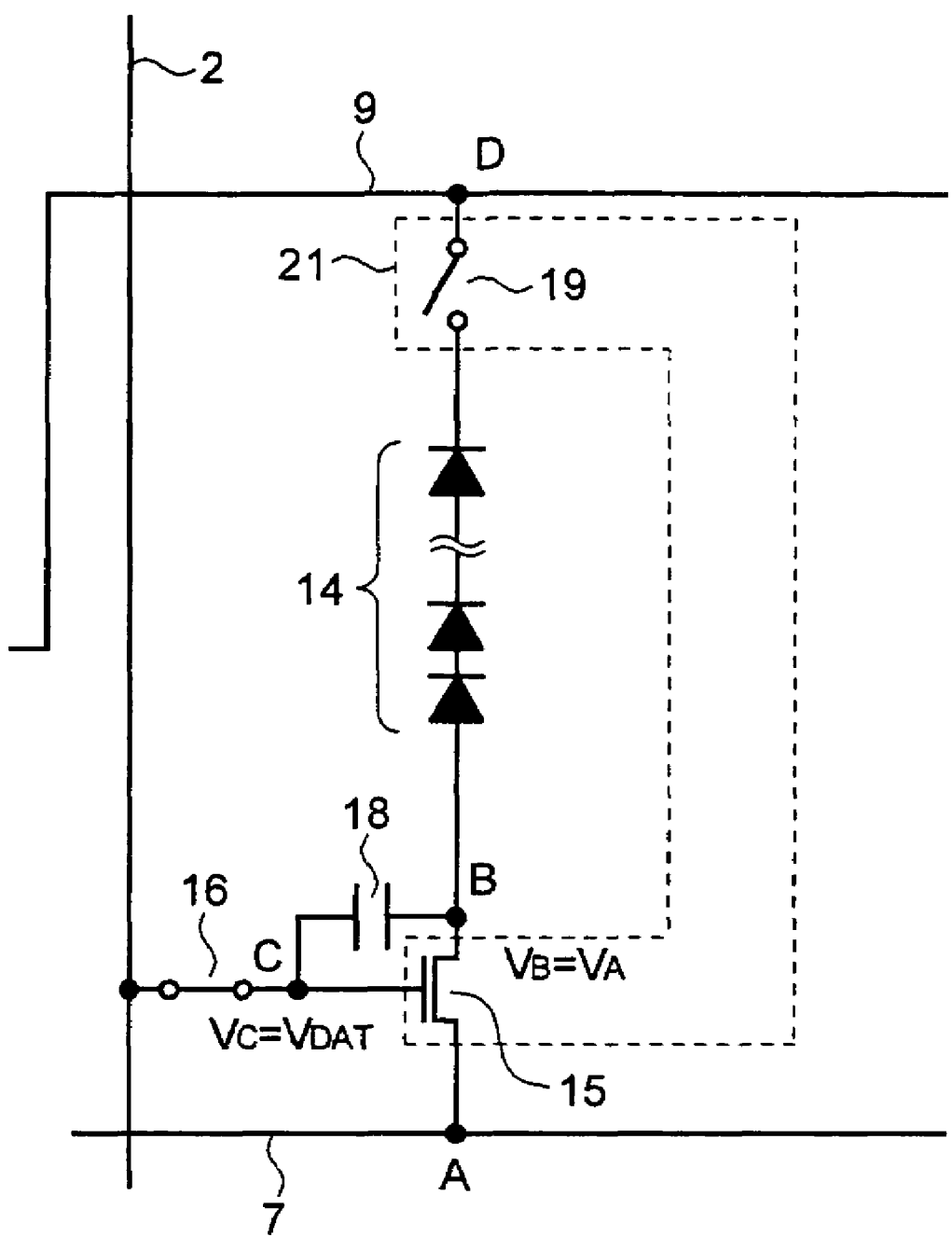

Then, as shown in FIG. 4C, a luminance potential $V_{DAT}$ is newly supplied from the data line 2, then a potential difference corresponding to a new light emitting luminance is set between the gate and the source of the driver 15. More specifically, the switching device 19 is kept to be OFF while the driver 15 and the switching device 16 are kept to be ON. Therefore, the electrical continuity between the gate electrode of the driver 15 and the data line 2 is maintained, and the potential $V_{DAT}$ of the data line 2 is supplied to the gate electrode of the driver 15. Since the potential $V_B$ of the source electrode of the driver 15 is kept to be $V_A$ as shown in Expression (3), the potential $V_{DAT}$ supplied from the data line 2 is set at the potential level between the gate and the source of driver 15, in other words, the potential $V_{DAT}$ is set at the potential level so that the level $V_{DAT} - V_A$ corresponds to the display luminance.

Figure 4D:
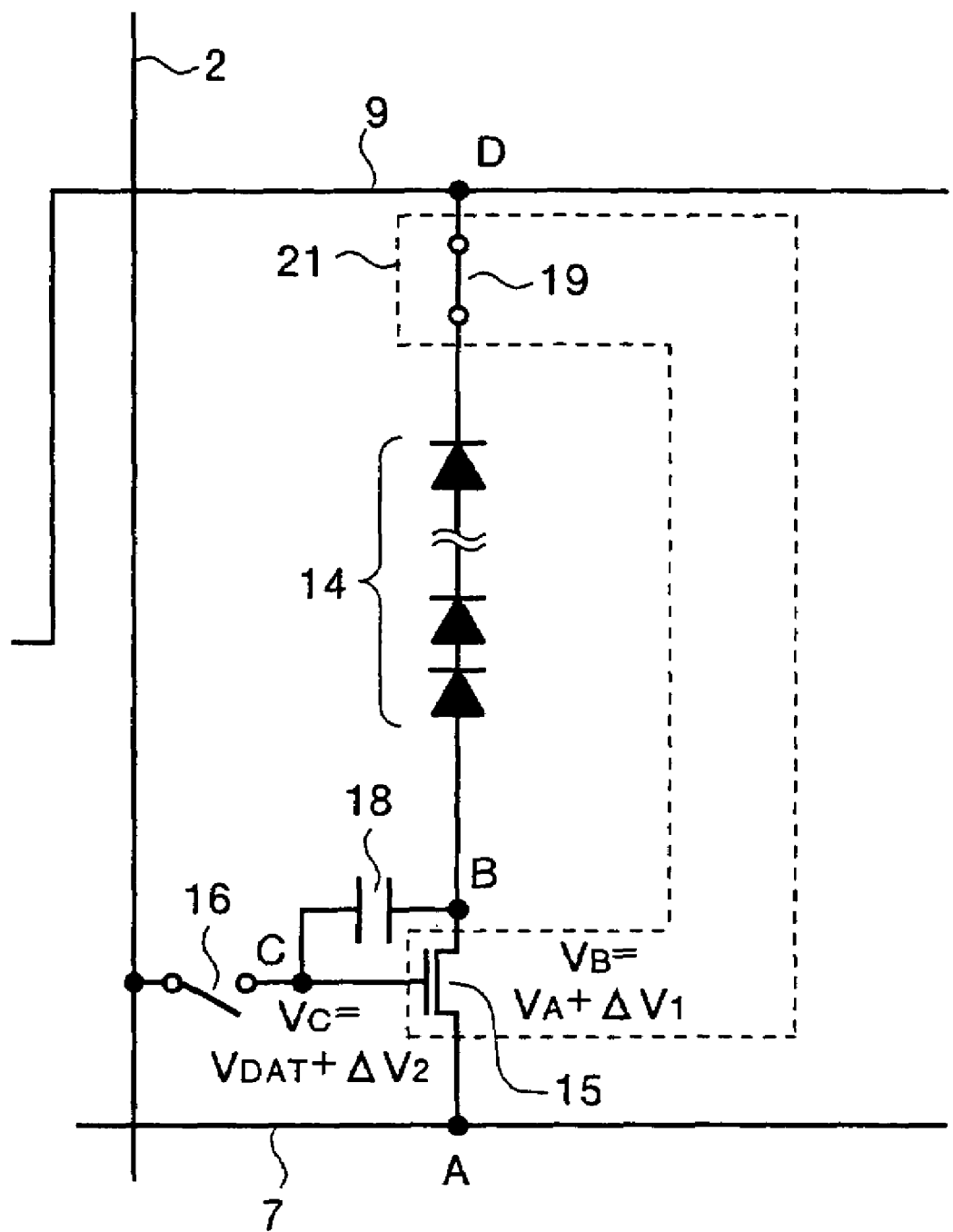

As shown in FIG. 4D, the electric current according to the potential difference which is set between the gate and the source of the driver 15 flows through the emission mechanism 14, and then the emission mechanism 14 emits light at a predetermined luminance. More specifically, the switching device 16 becomes OFF from ON while the switching device 19 becomes ON from OFF. Since a predetermined potential difference has been supplied between the gate and the source of the driver 15, a channel is produced between the drain and the source of the driver 15, so an electric current flows from the power supply line 7 through the diver 15, the emission mechanism 14, the switching device 19, and to the constant potential line 9, and as a result, the emission mechanism 14 emits light at a predetermined luminance.

The potential at Point B changes to a value different from $V_A$, since the electric current flows through the emission mechanism 14. Since the emission mechanism 14 is considered electrically equivalent to series-connected light-emitting diodes, the voltage $V_{OLED}$ according to the electric current value is being applied to each equivalent diode. Therefore, the voltage level $V_B$ at Point B can be represented as:

$$V_B = V_A + \Delta V_1 \quad (4)$$

where n is the number of the electrically equivalent diodes included in the emission mechanism 14. Here, $\Delta V_1$ can be represented as:

$$\Delta V_1 = (V_D + nV_{OLED}) - V_A \quad (5)$$

Figure 5:
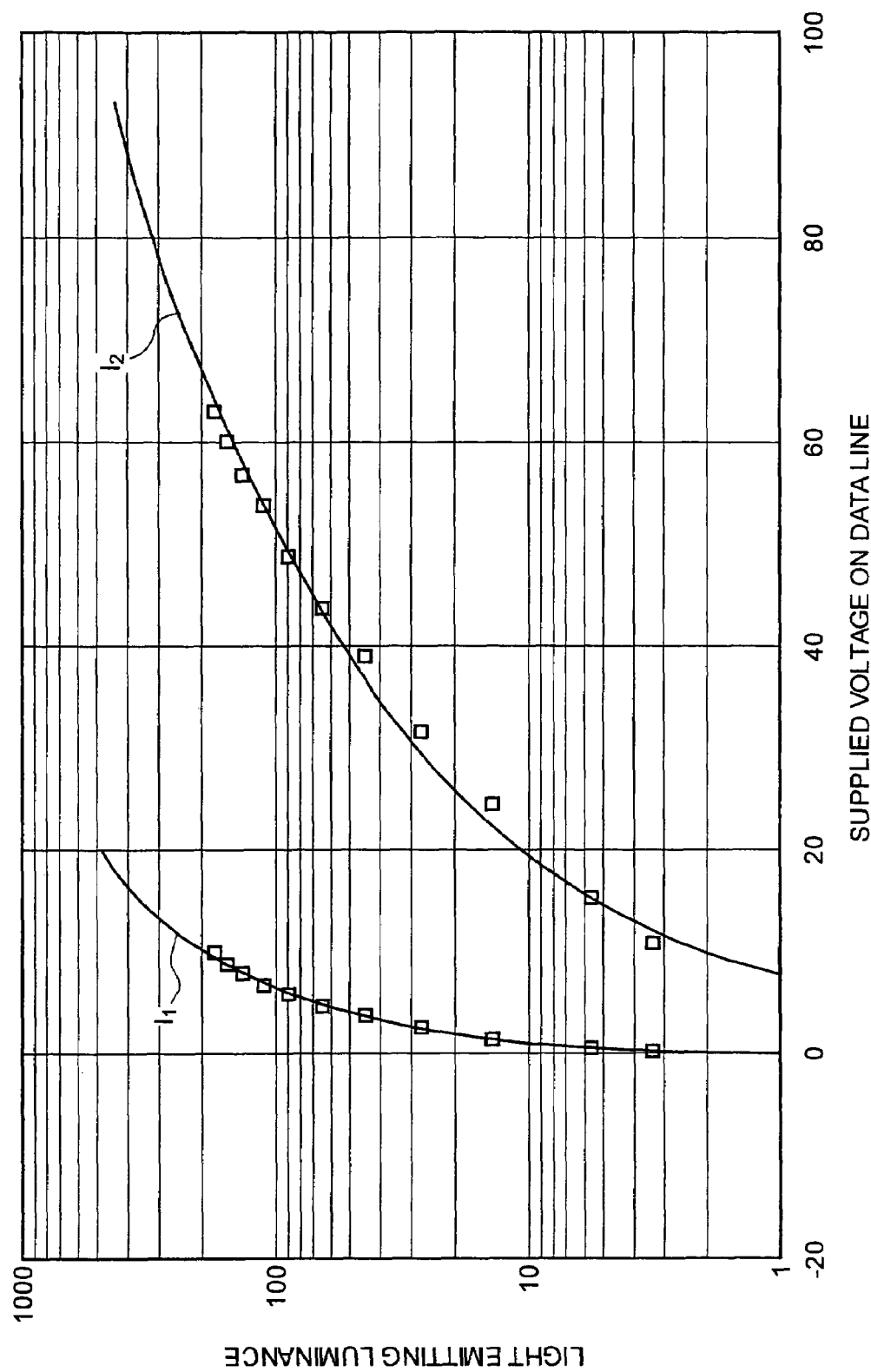
FIG. 5 is a graph showing a potential supply range of a data line driver circuit included in the image display device according to the first embodiment.

As shown in FIGS. 4 and 5, since the potential level $V_B$ changes and the capacitor 18 is arranged between the gate electrode and the source electrode of the driver 15, the gate potential of the driver 15 at Point C changes from $V_{DAT}$, and with a potential changing value $\Delta V_2$, the potential $V_C$ of Point C in the state shown in FIG. 4D can be represented as:

$$V_C = V_{DAT} + \Delta V_2 \quad (6)$$

More specifically, with the capacitance C of the capacitor 18, the parasitic capacitance $C_{gs}$ between the gate and the source of the driver 15, and the parasitic capacitance $C_{sd}$ between the source and the drain of the driver 15, the potential changing value $\Delta V2$ at Point C can be represented as:

$$\Delta V_2 = \{(C + C_{gs})/(C + C_{gs} + C_{sd})\}\Delta V_1 \quad (7)$$

Here, since the parasitic capacitance $C_{sd}$ between the source and the drain is much smaller than the sum of the capacitance C of the capacitor 18 and the parasitic capacitance $C_{gs}$ between the gate and the source and then $C_{sd}$ can be neglected, the coefficient of $\Delta V_1$ in Expression (7) can be approximated as one. Therefore, $\Delta V_2$ can be represented as:

$$\Delta V_2 \cong \Delta V_1 \quad (8)$$

As is clear from Expressions (4), (6), and (8), the potential between the gate and the source of the driver 15 of the state shown in FIG. 4D is kept to be the approximately same level as the level which is set in the state shown in FIG. 4C. As a result, at the light emitting state shown in FIG. 4D, the electric current whose value corresponds to the potential $V_{DAT}$ which is set from the data line 2 flows through the emission mechanism 14, and the emission mechanism 14 can emit light with the luminance corresponding to the potential $V_{DAT}$.

The advantages of the image display device according to the first embodiment will be explained. As shown in FIG. 4C, in the image display device according to the first embodiment, while the luminance potential $V_{DAT}$ is supplied to the gate electrode of the driver 15 via the data line 2, the potential level $V_B$ of the source electrode is kept to be a constant level (which is $V_A$) regardless of the light emitting luminance of the former frame. Therefore, in the image display device according to the first embodiment, the determination of the luminance potential $V_{DAT}$ does not require the consideration of the changes in the potential $V_B$ of the source electrode of the driver 15. Therefore the luminance potential $V_{DAT}$ is to be varied within the range of changes of the voltage between the gate and the source which is necessary according to the light emitting luminance, and the range in which the luminance potential $V_{DAT}$ is varied can be narrowed.

FIG. 5 is a graph showing a range of potential necessarily supplied from the data line driver circuit 3 via the data line 2 in the image display device according to the first embodiment. More specifically, in the graph shown in FIG. 5, Curb $l_1$ represents a range of potential according to the first embodiment, and Curb $l_2$ represents a range of potential according to the conventional image display device.

As shown in FIG. 5, when the contrast ratio was set 100, the potential supply had to be operated within a range from 20 V to 80 V in the conventional image display device (Curb $l_2$), while the operation of the potential supply via the data line 2 was sufficient within a range from 0 V to approximately 10 V in the image display device according to the first embodiment (Curb $l_1$). Therefore, the image display device according to the first embodiment has advantages of restraining the level range of the potential supplied via the data line 2, and enabling reduction of the load of the power supply circuit (the data line driver circuit 3).

The first switching unit and the driver 15 which are included in the potential adjusting unit are unified[MSOffice6] in the image display device according to the first embodiment. As shown in FIG. 1, the drain electrode of the driver 15 is connected to the power supply line 7 which is supplied a nearly constant potential from the power supply circuit 8, and while the driver 15 is controlled to be ON, the driver 15 supplies the constant potential of the power supply line 7 to the source electrode. Therefore, in the first embodiment, the driver 15 is supposed to function as the first switching unit, and by supplying the potential of the power supply line 7 to the source electrode via driver 15, the potential of the source electrode of the driver 15 is controlled to be a constant level during the setting of the luminance potential $V_{dat}$. Therefore, the image display device according to the first embodiment does not have to further include a first switching unit for maintaining the potential of the source electrode of the driver 15 during the setting of the luminance potential and a potential supply line, and as a result, the image display device has an advantage of being able to reduce the number of the circuit devices and wires arranged in a pixel circuit.

An image display device according to a second embodiment will be explained. The image display device according to the second embodiment has a structure that the control of the electrical continuity between the emission mechanism and the driver 15 by a potential adjusting unit makes a floating state of the anode side of the emission mechanism during the potential adjustment, while the luminance potential is supplied.

Figure 6:
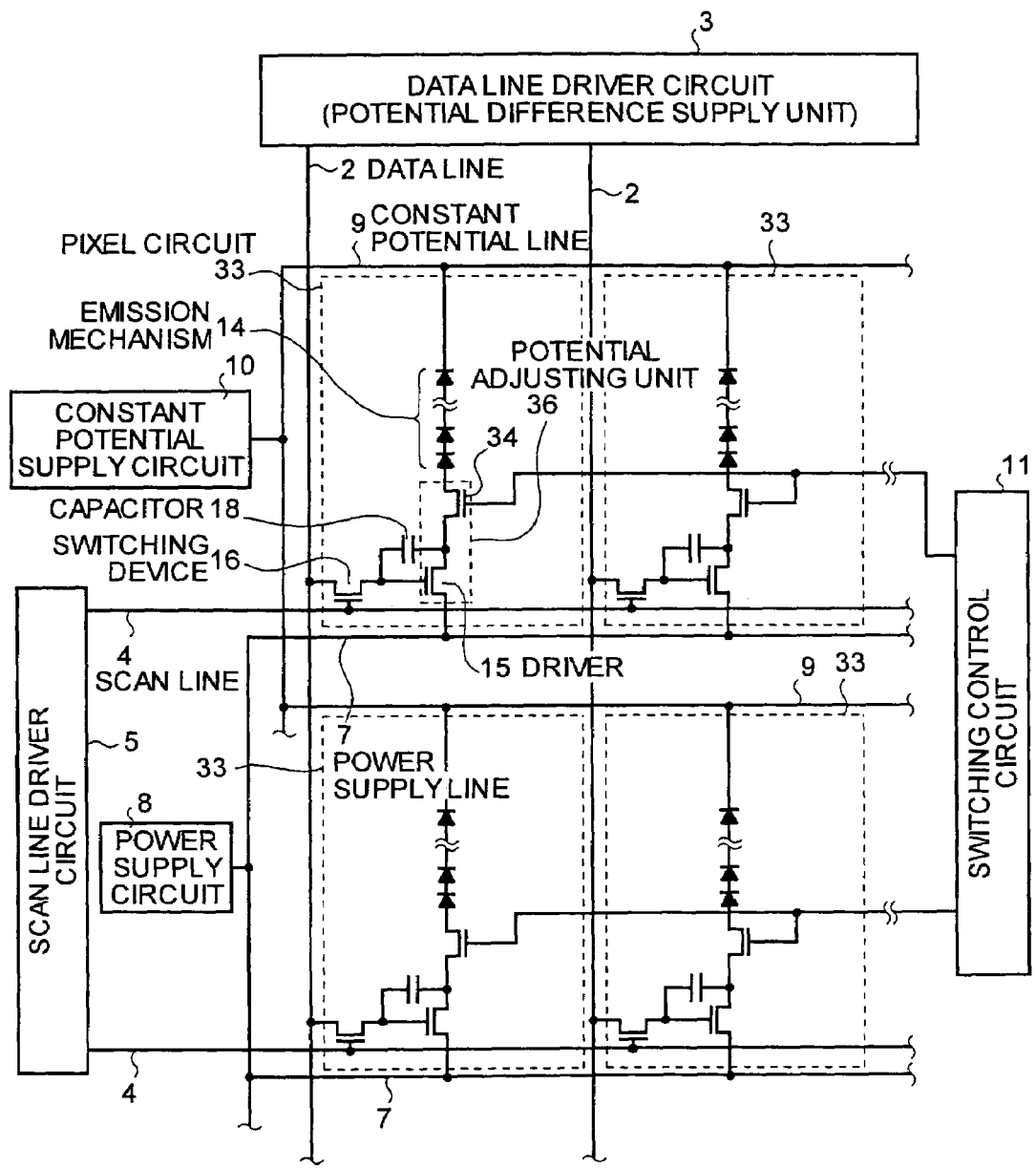
FIG. 6 is a schematic diagram of an overall structure of an image display device according to a second embodiment.

FIG. 6 is a schematic diagram of an overall structure of the image display device according to the second embodiment. As shown in FIG. 6, the image display device according to the second embodiment has the same basic structure as of the image display device according to the first embodiment, and, in a pixel circuit 33, has a structure including a potential adjusting unit 36 instead of the potential adjusting unit 21 of the first embodiment. In the image display device according to the second embodiment, those which have the same structure or the same function are given the same reference character and the same constituent element name as of the first embodiment, and operate the same way as of the first embodiment unless specified.

The potential adjusting unit 36 includes a driver 15 which corresponds to a first switching unit, and a switching device 34 which corresponds to a second switching unit and which controls the electrical continuity between the source electrode of the driver 15 and the anode side of the emission mechanism 14. Each switching device 34 is formed to include a thin-film transistor, and has a structure that the gate electrode of the switching device 34 is connected to the switching control circuit 11 and which operates depending on the potential supplied from the switching control circuit 11.

The image display device according to the second embodiment, while supplying the luminance potential, keeps the potential of the source electrode at a constant level (reference potential) by electrically connecting the source electrode of the driver 15 and the power supply line 7. Therefore, the image display device according to the second embodiment, same as in the case of the first embodiment, can maintain[MSOffice7] the potential of the source electrode as well as reduce the range of changes the luminance potential supplied from the data line driver circuit 3 compared with the conventional image display device regardless the change of potential at the anode side of emission mechanism 14.

The image display device according to the second embodiment that includes the switching device 34 has a structure insulating the electrical continuity between the source electrode of the driver 15 and the anode side of the emission mechanism 14 while supplying the luminance potential. More specifically, in the second embodiment, while the luminance potential is supplied, adapting the structure which electrically breaks the electrical conductivity between the anode side of the emission mechanism 14 and the source electrode of driver 15 maintains the potential of the anode side of the emission mechanism 14. Although the potential of the source electrode of the driver 15 changes when the luminance potential is supplied, it is possible to avoid the change of the anode of the emission mechanism 14, and to prevent the change of the potential difference between the anode and the cathode of the emission mechanism 14. Therefore, when the emitting mechanism 14 is made to emit light again after the supply of the luminance potential, it is possible to reduce the power-supply amount to make a desired level of the potential difference between the anode and the cathode of the emission mechanism 14.

In the first and second embodiments, although an example which is using the driver 15 as an example of the first switching unit is explained, a switching device controlling the electrical continuity between the source electrode of driver 15 and the potential supply line can be used. In that case, instead of using the power supply line 7 as the potential supply line, another constant potential line can be used.

An image display device according to a third embodiment will be described. In the image display device according to the third embodiment, the potential supply line connected to the cathode side of emission mechanism has a function of supplying higher potential than the potential of the anode side of the emission mechanism while the emission mechanism does not emit light.

Figure 7:
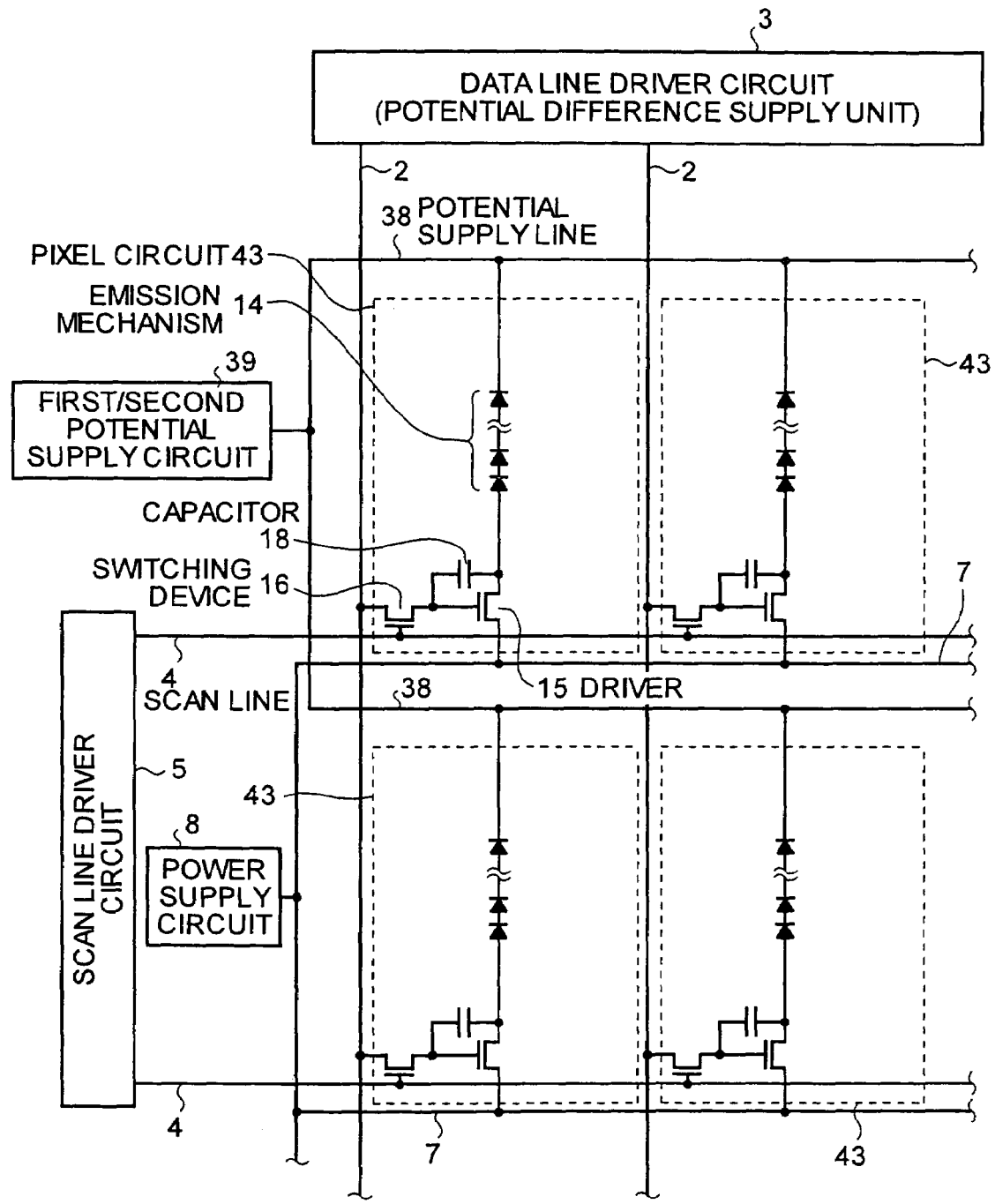
FIG. 7 is a schematic diagram of an overall structure of an image display device according to a third embodiment.

FIG. 7 is a schematic diagram of an overall structure of the image display device according to the third embodiment. As shown in FIG. 7, the image display device according to the third embodiment has a structure further including a potential supply line 38 supplying a first potential and a second potential, and a first/second potential supply circuit 39 supplying the first potential and the second potential to the potential supply line 38, instead of the constant potential line 9 of the first and the second embodiments.

The potential supply line 38 is arranged for performing two functions in the third embodiment. More specifically, as a first function, the potential supply line 38 has a function, which is the same as of the first and the second embodiments, of supplying the first potential that is a potential lower than that of the anode side to the cathode side of the emission mechanism 14, so that a forward voltage is applied between the anode and the cathode of the emission mechanism 14 while the emission mechanism 14 emits light.

The potential supply line 38, as a second function, has a function of operating as a part of the potential adjusting unit while the potential of the source electrode of the driver 15 is adjusted. More specifically, while the emission mechanism 14 does not emit light, especially while the potential of the source electrode is adjusted, the potential supply line 38 operates to supply a second potential that is a potential higher than the potential of the anode side to the cathode side of the emission mechanism 14, and the operation avoids the electric current to flow from the emission mechanism 14 to the potential supply line 38 during the potential adjustment. By applying a reverse voltage to the emission mechanism 14 which is equivalent to diodes during the potential adjustment, the potential supply line 38 restrains the flow of the electric current in the emission mechanism 14 during the potential adjustment, and as a result, it is performing the same function as the switching device 19 according to the first embodiment and switching device 34 according to the second embodiment.

As explained, by arranging the first/second potential supply circuit 39 which switches the potential of the cathode side of the emission mechanism 14 from the first potential to the second potential when the potential is adjusted, the image display device according to the third embodiment enables the operation of the second switching unit (switching devices 19 and 34) which restrains the flow of the electric current through the emission mechanism 14. Therefore, the image display device according to the third embodiment has an advantage of being able to omit the second switching unit and the wire mechanism controlling the second switching unit.

Figure 8:
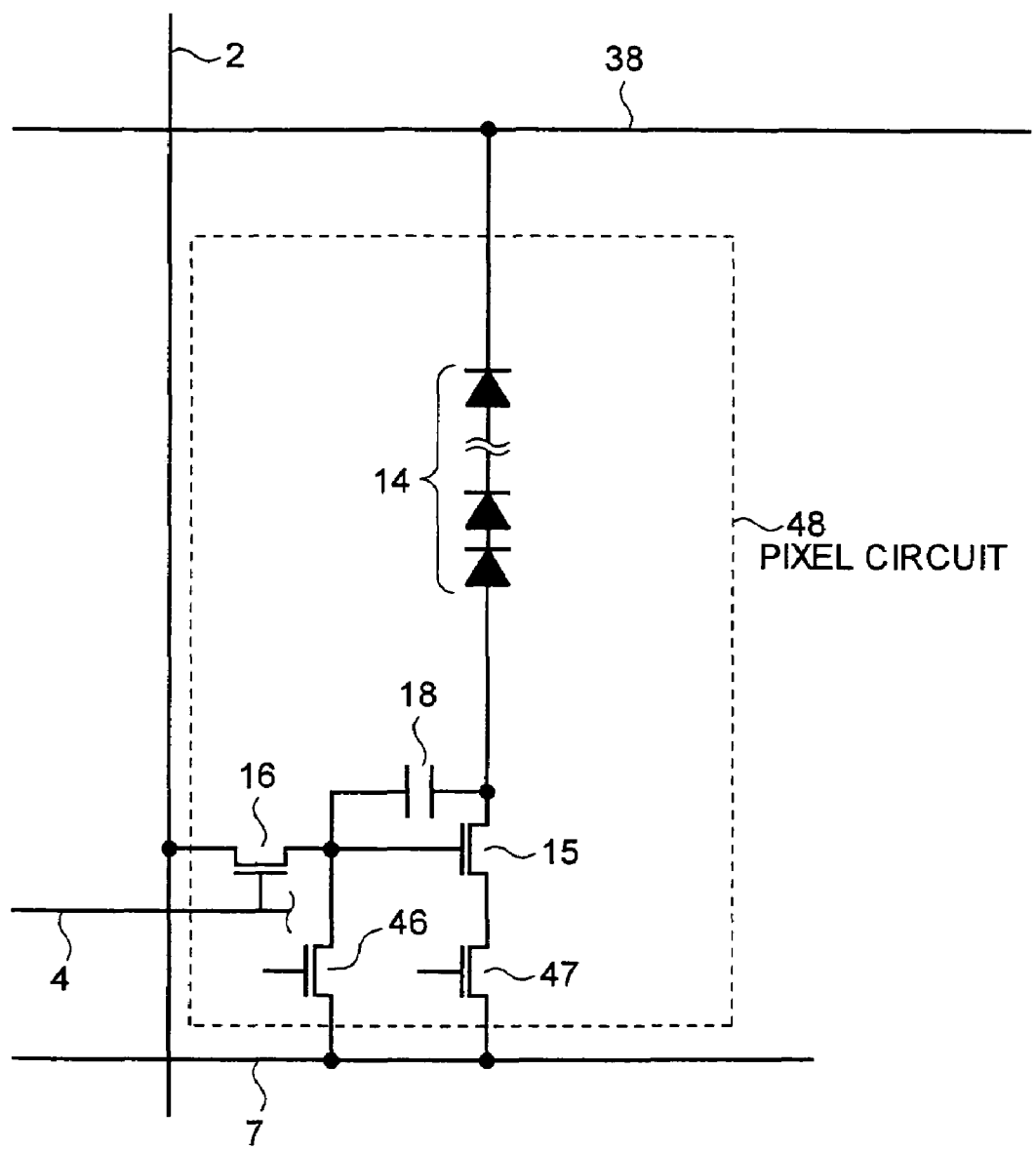
FIG. 8 is a schematic diagram of a structure of a pixel circuit according to a first modification of the third embodiment.

An image display device according to a first modification of the third embodiment will be described. FIG. 8 is a schematic diagram showing a pixel circuit 48 and a wire mechanism arranged around the pixel circuit 48 which are included in the image display device according to the first modification. In the first modification, as shown in FIG. 8, there is a structure including the switching device 46 which controls the electrical continuity between the gate electrode of the driver 15 and the power supply line 7 and the switching device 47 which controls the electrical continuity between the drain electrode of the driver 15 and the power supply line 7 in the pixel circuit 48.

The switching device 46, by discharging the electric charge remaining in the gate electrode, enables supplying the luminance potential in the state that the potential of the gate electrode is made to be equal to the potential of the power supply line 7. More specifically, switching device 46 becomes ON just before the supply of the luminance potential via the data line 2 and the switching device 16, and making the electrical continuity between the gate electrode of the driver 15 and the power supply line 7 changes the potential of the gate electrode of the driver 15 to the same potential as of the power supply line 7 regard less of remaining quantity of the electrical charge.

The switching device 47 avoids the electric current to flow in the emission mechanism 14 while the emission mechanism 14 does not emit light. More specifically, the switching device 47 is kept OFF while the emission mechanism 14 does not emit light, and by insulating the electrical continuity between the power supply line 7 and the emission mechanism 14, avoids the electric current to flow through emission mechanism 14. The arrangement of the switching device 47 enables avoiding the emission mechanism 14 to emit light at non-emitting timing, and the quality of the image can be improved.

Figure 9:
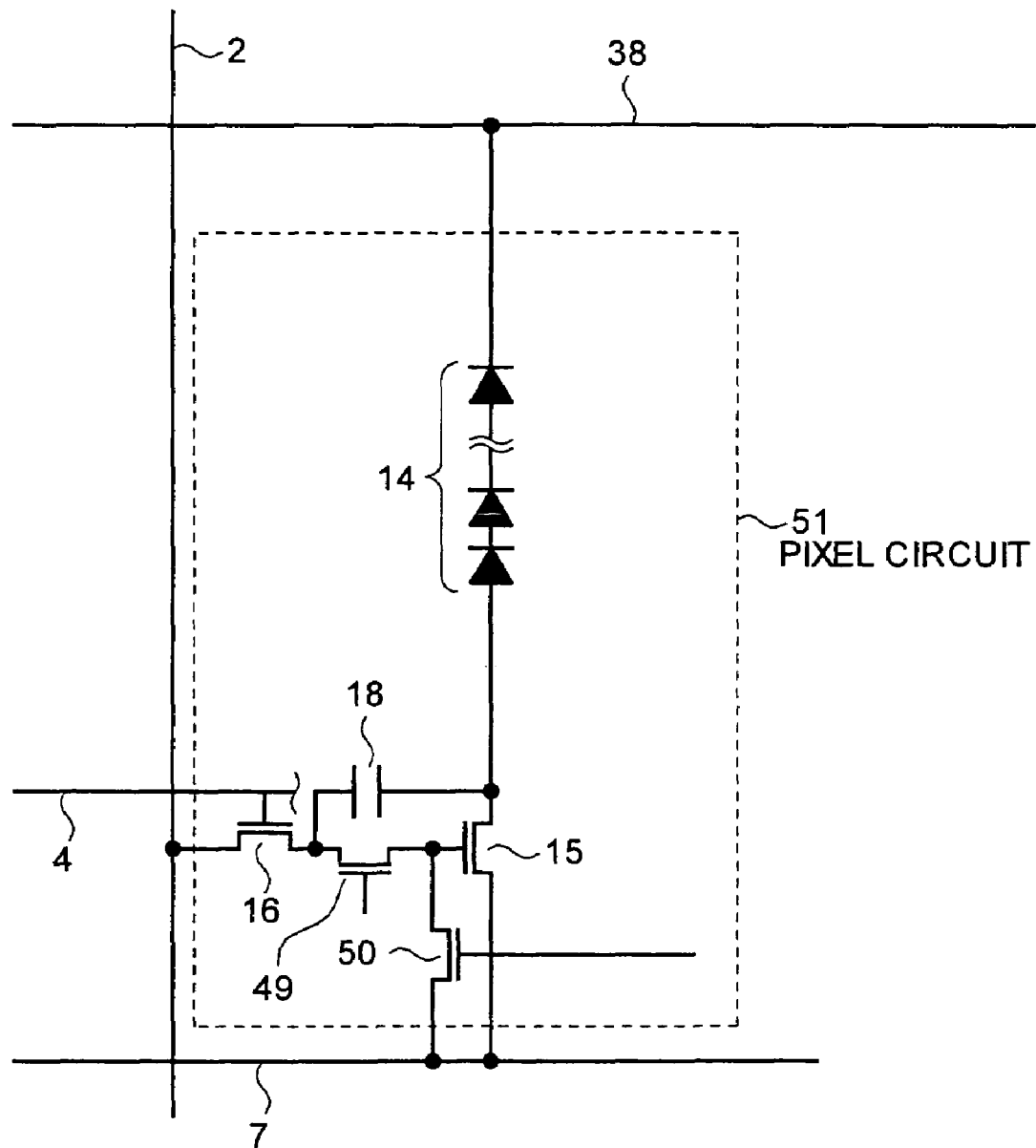
FIG. 9 is a schematic diagram of a structure of a pixel circuit according to a second modification of the third embodiment.
Figure 10:
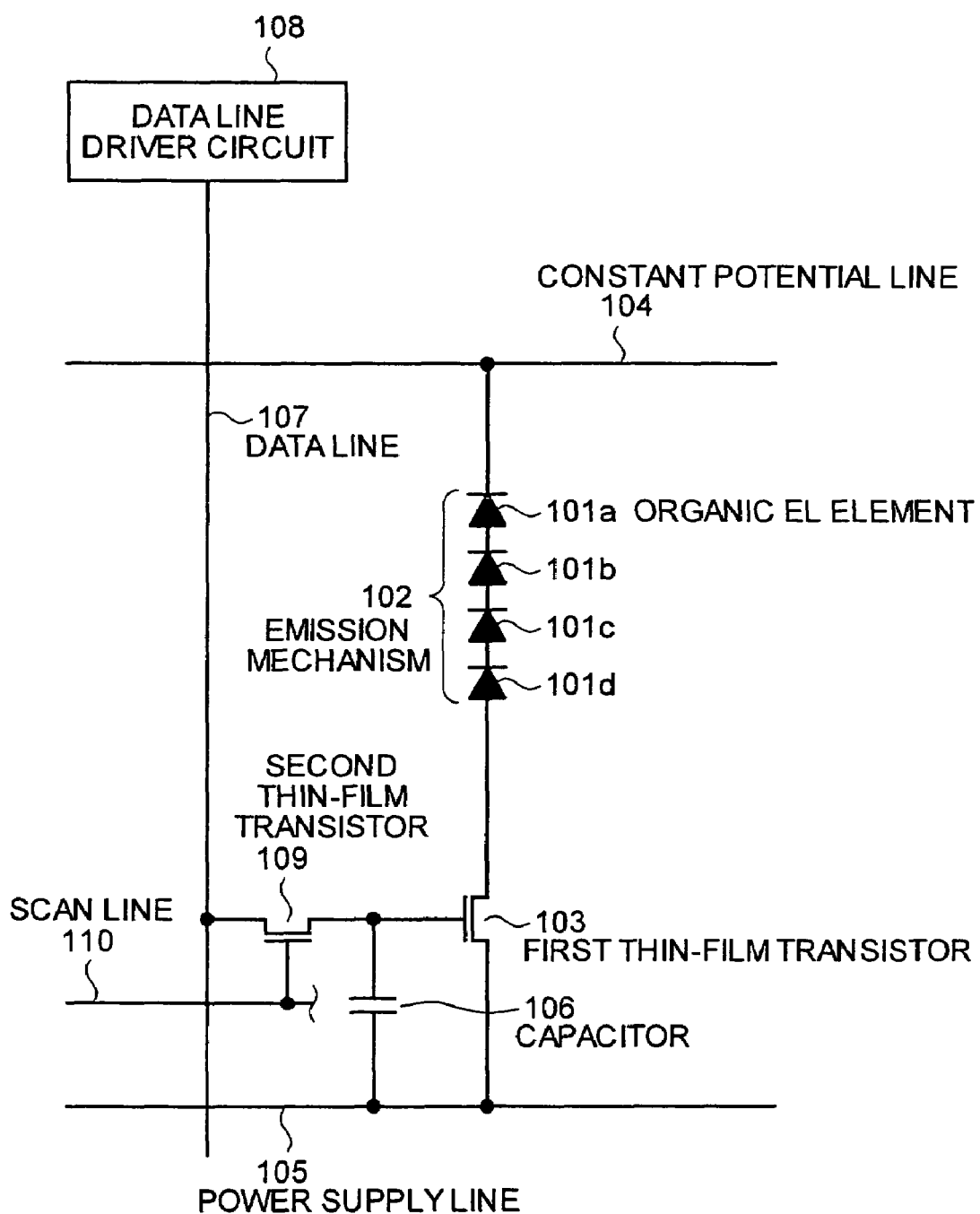
FIG. 10 is a schematic diagram of a structure of a pixel circuit included in a conventional image display device.

An image display device according to a second modification of the third embodiment will be described. FIG. 9 is a schematic diagram showing a pixel circuit 51 and a wire mechanism arranged around the pixel circuit 51 which are included in the image display device according to the second modification. As shown in FIG. 9, the image display device according to the second modification has a structure including a switching device 49 which controls the electrical continuity between the gate electrode of the driver 15 and the switching device 16 and the electrical continuity between the gate electrode of the driver 15 and the capacitor 18, and a switching device 50 which controls the electrical continuity between the gate electrode of the driver 15 and the power supply line 7. The switching device 50 has the same function as of switching device 46 of the first modification. Just before the supply of the luminance potential, it discharges the electric charge remaining in the gate electrode of the driver 15, and makes the potential of the gate electrode the same potential as of the power supply line 7 regardless of the light emitting luminance of the former frame.

The switching device 49, apart from the switching device 16, controls the timing of giving the luminance potential supplied via the data line 2 to the gate electrode of the driver 15. While switching device 16 is turned ON and the luminance potential is supplied via the data line 2, the switching device 49 is kept to be OFF, and the luminance potential does not arrive at the gate electrode of the driver 15 and is stored in the capacitor 18. The switching device 49 becomes ON when the light-emitting timing of the emission mechanism comes, then the luminance potential is supplied to the gate electrode of the driver 15, the electric current according to the light emitting luminance travels between the drain and the source, and the emission mechanism 14 emits light at a predetermined luminance. Here, in all the pixel circuits included in the image display device, the switching devices 49 can be turned ON at once. When the structure is employed, the emission mechanisms 14 included in all the pixel circuits 51 included in the image display device emit light at once, and the display of high quality is enabled.

The first, the second, and the third embodiments and the first and the second modifications are described according to the invention. The invention should not be limited to the embodiments, and those skilled in the art can think various embodiments, modification, and the like. For example, although the first and the second modifications are introduced as modifications of the image display device according to the third embodiment, it is not limited to the structure, and the switching device 46 and 47, or switching device 49 and 50 can be included in the pixel circuit according to the first or the second embodiment.

The applicable scope of the invention is not limited to the emission mechanism considered electrically equal to series-connected plural diodes, but also, for example, can be an organic EL device whose emission mechanism including single light emitting layer. The emission mechanism can be inorganic EL device or another light emitting device instead of the organic EL device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An image display device comprising:
    a light-emitting device that emits light with a luminance depending on an electric current flowing therethrough;
    a driver that includes at least a first terminal and a second terminal, and supplies an electric current whose value is defined based on a potential difference between the first terminal and the second terminal to the light-emitting device;
    a potential difference supply unit that supplies the potential difference between the first terminal and the second terminal;
    a potential adjusting unit that adjusts so that the potential of the second terminal becomes a reference potential when the potential difference supply unit supplies the potential difference; and
    a capacitor that is arranged between the first terminal and the second terminal, and holds the potential difference supplied from the potential difference supply unit.

2. The image display device according to claim 1, wherein the driver includes a thin-film transistor whose gate electrode is the first terminal and whose source electrode is the second terminal, and
    the potential difference supply unit supplies the potential difference between the first terminal and the second terminal by supplying an potential to the first terminal.

3. The image display device according to claim 1, wherein the light-emitting device is arranged to electrically connect to the second terminal, and
    the potential adjusting unit changes at least one of a cathode side or an anode side of the light-emitting device to a floating state while the potential difference supply unit supplies the potential difference.

4. The image display device according to claim 1, further comprising:
    a potential supply line that supplies a constant potential to the second terminal when at least electrically connected to the second terminal of the driver; and
    a first switching unit that electrically connects the second terminal to the potential supply line when the potential difference supply unit supplies the potential difference.

5. The image display device according to claim 4, wherein the driver includes a thin-film transistor whose gate electrode is the first terminal and whose source electrode is the second terminal,
    the potential supply line is connected to the drain electrode of the thin-film transistor, and includes a power supply line that supplies an electric current to the light-emitting device via the thin-film transistor, and
    the first switching unit and the thin-film transistor are unified.

6. The image display device according to claim 4, further comprising a constant potential line at least electrically connected to a cathode side of the light-emitting device at least during light emission, wherein the potential adjusting unit further includes a second switching unit that breaks the electrical continuity between the cathode side of the light-emitting device and the constant potential line when the potential difference supply unit supplies the potential difference.

7. The image display device according to claim 4, further comprising a second switching unit that breaks the electrical continuity between an anode side of the light-emitting device and the second terminal when the potential difference supply unit supplies the potential difference.

8. The image display device according to claim 1, wherein the light-emitting device has a function that an electric current flows from an anode side to a cathode side only, and
    the potential adjusting unit is connected to the cathode side of the light-emitting device, supplies a first potential lower than a potential of the anode side of the light-emitting device to the cathode side of the light-emitting device while the light-emitting device emits light, and supplies a second potential higher than the potential of the anode side of the light-emitting device to the cathode side of the light-emitting device while the light-emitting device does not emit light.

9. A method for driving an image display device that includes a light-emitting device having a first terminal and a second terminal, and a thin-film transistor having a drain electrode, a source electrode, and a gate electrode, one of the drain and source electrodes being electrically connected to the first terminal of the light-emitting device, the method comprising:

setting potentials of the drain and source electrodes so that the potentials are substantially the same by turning on the thin-film transistor and by supplying a predetermined potential to the other of the drain and source electrodes while the light-emitting device is in a non-emission state;

supplying a luminance potential corresponding to a luminance of the light-emitting device to the gate electrode while the light-emitting device is in a non-emission state and the potentials are substantially the same; and supplying an electric current according to the supplied luminance potential to the light-emitting device to emit light from the light-emitting device.

10. The method for driving an image display device according to claim 9, wherein a potential of the gate electrode is kept at not more than ten volts.

11. The method for driving an image display device according to claim 9, wherein the second terminal of the light-emitting device is connected to one of a power source line and a constant potential line via a switching device, the method further comprising turning off the switching device so that the light-emitting device is in the non-emission state.

12. The method for driving an image display device according to claim 9, wherein a switching device is located between the first terminal of the light-emitting device and the one of the drain and source electrodes, the method further comprising electrically disconnecting the thin-film transistor from the light-emitting device when the luminance potential is supplied to the gate electrode.

13. The method for driving an image display device according to claim 9, wherein the second terminal of the light-emitting device is connected to a power source line to which a variable potential is supplied, the method further comprising setting a potential of the power source line to a value higher than a potential of the second terminal of the light-emitting device so that the light-emitting device is in the non-emission state.

* * * * *